United States Patent
Yu et al.

(10) Patent No.: US 11,387,436 B2
(45) Date of Patent: Jul. 12, 2022

(54) INKJET PRINTING METHOD OF ARRAY SUBSTRATE, ARRAY SUBSTRATE AND DISPLAY DEVICE

(71) Applicant: BOE TECHNOLOGY GROUP CO., LTD., Beijing (CN)

(72) Inventors: Donghui Yu, Beijing (CN); Guang Yan, Beijing (CN); Chunjing Hu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 493 days.

(21) Appl. No.: 16/470,631

(22) PCT Filed: Nov. 15, 2018

(86) PCT No.: PCT/CN2018/115676
§ 371 (c)(1),
(2) Date: Jun. 18, 2019

(87) PCT Pub. No.: WO2019/200903
PCT Pub. Date: Oct. 24, 2019

(65) Prior Publication Data
US 2021/0408503 A1      Dec. 30, 2021

(30) Foreign Application Priority Data
Apr. 20, 2018   (CN) .......................... 201810359626.X (51) Int. Cl.
*H01L 51/56* (2006.01)
*H01L 51/50* (2006.01)
(Continued)

(52) U.S. Cl.
CPC .......... *H01L 51/56* (2013.01); *H01L 27/3216* (2013.01); *H01L 27/3246* (2013.01);
(Continued)

(58) Field of Classification Search
CPC ............. H01L 27/3216; H01L 51/0011; H01L 51/0005
See application file for complete search history.

(56) References Cited

U.S. PATENT DOCUMENTS 9,768,382 B2 * 9/2017 Wang .................. H01L 51/0005
10,367,037 B2   7/2019 Iguchi et al.
(Continued)

FOREIGN PATENT DOCUMENTS

CN       103311269 A      9/2013
CN       104465671 A      3/2015
(Continued)

OTHER PUBLICATIONS

International Search Report of PCT/CN2018/115676 in Chinese, dated Feb. 14, 2019 with English translation.
(Continued)

*Primary Examiner* — Victoria K. Hall
(74) *Attorney, Agent, or Firm* — Collard & Roe, P.C.

(57) ABSTRACT

An inkjet printing method of an array substrate, an array substrate, and a display device are disclosed. The array substrate includes n kinds of sub-pixels; and the inkjet printing method includes: recording a solvent volume required for inkjet printing of an i-th kind of sub-pixel as Vi; calculating an Xi value for each kind of the n kinds of sub-pixels, in which Xi=Vi/V1, and V1 refers to a solvent volume required for inkjet printing of a first kind of sub-pixels; taking a greatest common divisor of the Xi values of the n kinds of sub-pixels, and recording the greatest common divisor as G; and dividing the i-th kind of sub-pixel into Xi/G subunits with equal areas, and performing inkjet printing on each of the subunits of the i-th kind of sub-pixel with a solvent volume of V1*G to form a film layer.

11 Claims, 4 Drawing Sheets

(51) Int. Cl.
  *H01L 27/32* (2006.01)
  *H01L 51/00* (2006.01)
  *H01L 51/52* (2006.01)

(52) U.S. Cl.
  CPC ...... *H01L 51/5012* (2013.01); *H01L 27/3262* (2013.01); *H01L 51/0005* (2013.01); *H01L 51/5206* (2013.01); *H01L 2227/323* (2013.01)

(56) References Cited

U.S. PATENT DOCUMENTS

| | | | | |
|---|---|---|---|---|
| 10,446,622 B2* | 10/2019 | Wang | ............... | H01L 21/0274 |
| 2009/0121983 A1* | 5/2009 | Sung | ............... | H01L 27/3218 |
| | | | | 345/76 |
| 2013/0083080 A1* | 4/2013 | Rappoport | ............... | G09G 3/3225 |
| | | | | 345/690 |
| 2014/0197396 A1* | 7/2014 | Madigan | ............... | H01L 27/3246 |
| | | | | 257/40 |
| 2014/0361965 A1* | 12/2014 | Cheng | ............... | H01L 27/3218 |
| | | | | 345/83 |
| 2015/0364712 A1* | 12/2015 | Lee | ............... | H01L 27/3218 |
| | | | | 257/40 |
| 2016/0043150 A1* | 2/2016 | Wang | ............... | H01L 51/56 |
| | | | | 257/40 |
| 2016/0181327 A1* | 6/2016 | Im | ............... | H01L 51/0013 |
| | | | | 257/40 |
| 2016/0276615 A1* | 9/2016 | Kitabayashi | ............... | H01L 51/5265 |
| 2017/0062536 A1* | 3/2017 | Madigan | ............... | H01L 51/5218 |
| 2017/0077404 A1* | 3/2017 | Park | ............... | H01L 51/5231 |
| 2017/0092705 A1* | 3/2017 | Lim | ............... | H01L 27/326 |
| 2017/0162633 A1* | 6/2017 | Kitabayashi | ............... | H01L 51/0003 |
| 2018/0034000 A1* | 2/2018 | Lee | ............... | H01L 27/3258 |
| 2018/0053812 A1* | 2/2018 | Wacyk | ............... | H01L 51/0011 |
| 2018/0166510 A1* | 6/2018 | Lee | ............... | H01L 27/3211 |
| 2018/0315800 A1* | 11/2018 | Iguchi | ............... | H01L 27/32 |
| 2019/0067578 A1* | 2/2019 | Kishimoto | ............... | H01L 51/56 |

FOREIGN PATENT DOCUMENTS

| | | |
|---|---|---|
| CN | 106935632 A | 7/2017 |
| CN | 207134357 U | 3/2018 |
| CN | 108520891 A | 9/2018 |

OTHER PUBLICATIONS

Notice of Transmittal of the International Search Report of PCT/CN2018/115676 in Chinese, dated Feb. 14, 2019.
Written Opinion of the International Searching Authority of PCT/CN2018/115676 in Chinese, dated Feb. 14, 2019 with English translation.

* cited by examiner

INKJET PRINTING METHOD OF ARRAY SUBSTRATE, ARRAY SUBSTRATE AND DISPLAY DEVICE

CROSS REFERENCE TO RELATED APPLICATIONS

This application is the National Stage of PCT/CN2018/115676 filed on Nov. 15, 2018, which claims priority under 35 U.S.C. § 119 of Chinese Application No. 201810359626.X filed on Apr. 20, 2018, the disclosure of which is incorporated by reference.

TECHNICAL FIELD

Embodiments of the present disclosure relate to an inkjet printing method of an array substrate, an array substrate and a display device.

BACKGROUND

Organic light emitting diode (OLED) display panel has the advantages of autoluminescence, fast response, wide viewing angle, high brightness, beautiful color, and thin and light property, and thus becomes an important display technology. For example, the OLED display panel includes a plurality of sub-pixels arranged in an array, and each sub-pixel generally includes structures such as an organic light emitting element and a thin film transistor (TFT). For example, a light emitting layer of the organic light emitting element can be formed by a method such as inkjet printing or vapor deposition. The inkjet printing method has become one of the commonly used methods for forming organic film layers due to the advantages of high deposition speed, good uniformity and low equipment investment.

SUMMARY

At least one embodiment of the present disclosure provides an inkjet printing method of an array substrate, the array substrate includes n kinds of sub-pixels; solvent volumes of solutions required for inkjet printing of the n kinds of sub-pixels are different; n is a positive integer greater than or equal to 2; and the method includes: recording a solvent volume required for inkjet printing of an i-th kind of sub-pixel as Vi, in which i is a positive integer less than or equal to n; calculating an Xi value for each kind of the n kinds of sub-pixels, in which Xi=Vi/V1, and V1 refers to a solvent volume required for inkjet printing of a first kind of sub-pixels; taking a greatest common divisor of the Xi values of the n kinds of sub-pixels, and recording the greatest common divisor as G; and dividing the i-th kind of sub-pixel into Xi/G subunits with equal areas, and performing inkjet printing on each of the subunits of the i-th kind of sub-pixel with a solvent volume of V1*G to form a film layer.

For example, in the method provided by an embodiment of the present disclosure, upon a value of the Xi/G being greater than or equal to 2, two adjacent ones of the subunits of the i-th kind of sub-pixel are separated from each other.

For example, the method provided by the an embodiment of the present disclosure further includes: before performing the inkjet printing, forming a unit define layer in the i-th kind of sub-pixel with the Xi/G is greater than or equal to 2, to define the Xi/G subunits.

For example, in the method provided by an embodiment of the present disclosure, performing the inkjet printing on each of the subunits of the i-th kind of sub-pixel with a solvent volume of V1*G to form the film layer includes: performing the inkjet printing of a solution including the solvent of the solvent volume of V1*G on each of the subunits of the i-th kind of sub-pixel; and simultaneously drying the solutions of the n kinds of sub-pixels to form the film layer.

For example, in the method provided by an embodiment of the present disclosure, the film layer includes at least one selected from the group consisting of a light emitting layer, an electron transport layer, an electron injection layer, a hole transport layer and a hole injection layer.

For example, in the method provided by the an embodiment of the present disclosure, upon a value of the Xi/G being greater than or equal to 2, an interval between two adjacent ones of the subunits of the i-th kind of sub-pixel is not greater than an interval between two adjacent ones of sub-pixels in the n kinds of sub-pixels.

For example, the method provided by an embodiment of the present disclosure further includes: upon a value of the Xi/G being greater than or equal to 2, forming a channel for connecting two adjacent ones of the subunits in the unit define layer between the two adjacent ones of the subunits of the i-th kind of sub-pixel, in a direction perpendicular to an arrangement direction of the two adjacent ones of the subunits, a size of the channel is less than a size of each of the subunits.

For example, in the method provided by an embodiment of the present disclosure, calculating the Xi value includes: upon a number of digits after a decimal point of the Xi value being greater than or equal to 2, reserving one decimal number for the Xi value by a rounding-off method.

For example, in the method provided by an embodiment of the present disclosure, an area of the film layer of the i-th kind of sub-pixel is recorded as Si; areas of the film layers of at least one two kinds of sub-pixels in the n kinds of sub-pixels are different; and the solvent volumes Vi for forming the film layers of the at least two kinds of sub-pixels are positively related to the area Si.

For example, in the method provided by an embodiment of the present disclosure, n is equal to 3 and the n kinds of sub-pixels are respectively red sub-pixels, green sub-pixels and blue sub-pixels.

For example, in the method provided by an embodiment of the present disclosure, Vi=Ci*(1−Bi), Ci refers to the solution volume required for the inkjet printing of the i-th kind of sub-pixel, and Bi refers to a volume concentration of the solution for the inkjet printing of the i-th kind of sub-pixel.

At least one embodiment of the present disclosure provides an array substrate, including n kinds of sub-pixels arranged in an array, wherein n is a positive integer greater than or equal to 2, and each kind of the n kinds of sub-pixel includes an organic light emitting element; and at least one film layer in the organic light emitting element of at least one kind of sub-pixels in the n kinds of sub-pixels includes a plurality of subparts which are mutually separated.

For example, in the array substrate provided by an embodiment of the present disclosure, the plurality of subparts are separated by a unit define layer.

For example, in the array substrate provided by an embodiment of the present disclosure, in a same kind of sub-pixels, areas of the plurality of subparts are equal.

For example, in the array substrate provided by an embodiment of the present disclosure, an interval between two adjacent ones of the plurality of subparts is not greater than an interval between two adjacent ones of sub-pixels in the n kinds of sub-pixels.

For example, in the array substrate provided by an embodiment of the present disclosure, a connecting portion is also disposed between two adjacent ones of the plurality of subparts; and in a direction perpendicular to an arrangement direction of the two adjacent ones of the plurality of subparts, a size of the connecting portion is less than a size of each of the plurality of subparts.

For example, in the array substrate provided by an embodiment of the present disclosure, each kind of the n kinds of sub-pixels further includes a pixel electrode; the pixel electrode is a continuous electrode layer; and in a sub-pixel including the plurality of subparts, the plurality of subparts are electrically connected with the same pixel electrode.

At least one embodiment of the present disclosure provides a display device, including the array substrate according to any one of above.

BRIEF DESCRIPTION OF THE DRAWINGS

In order to clearly illustrate the technical solution of embodiments of the present disclosure, the drawings of the embodiments will be briefly described in the following, it is obvious that the drawings in the description are only related to some embodiments of the present disclosure and not limited to the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be in the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Likewise, the terms "a," "an," and "the" are not intended to indicate any amount. Also, the terms "include," "including," "include," "including," etc., are intended to specify that the elements or the objects stated before these terms encompass the elements or the objects and equivalents thereof listed after these terms, but do not preclude the other elements or objects. The terms "connection", "connected" and the like are not limited to physical or mechanical connection but may include electrical connection, either directly or indirectly. "On," "under," "right," "left" and the like are only used to indicate relative position relationship, and when the position of the object which is described is changed, the relative position relationship may be changed accordingly.

OLED display panel has been widely used in various display devices due to the advantages of autoluminescence, fast response, wide viewing angle, high brightness, beautiful color, and thin and light property. For example, a method for forming an organic light emitting element includes a method such as vacuum evaporation and a solution method. For example, the vacuum evaporation method has good film forming uniformity and is a relatively mature technology, but the equipment required by the vacuum evaporation method is generally expensive and the utilization rate of materials is generally low. In addition, upon a large-size display product being manufactured by the vacuum evaporation method, alignment accuracy of a vapor deposition mask is generally low, which can easily cause poor phenomena such as color mixing in a display area of the display product manufactured by the evaporation method.

For example, the solution method includes a spin coating method, an inkjet printing method, a dropping method, etc. The equipment cost required for preparing a film by the solution method is generally low, so that the production cost can be effectively reduced, and large-scale and large-size products can be manufactured. For example, inkjet printing (IJP) is a non-contact, pressure-free and plate-free printing technique that uses an external force to squeeze a solution such as ink droplets in a nozzle out of the nozzle and spray and deposit the solution onto corresponding positions to form desired patterns. Thus, the inkjet printing process has accurate positioning function, and the solution such as the ink droplet can be sprayed and deposited at a specific position as needed to form the desired patterns. For example, upon an organic light emitting element of a display panel being manufactured by the inkjet printing method, an inkjet device can efficiently inject a solution accurately into a sub-pixel region of the display panel to form a desired film. For example, the film may be a red light emitting layer, a green light emitting layer or a blue light emitting layer in the organic light emitting element, so that the display panel including the organic light emitting element can achieve color display.

Figure 1:
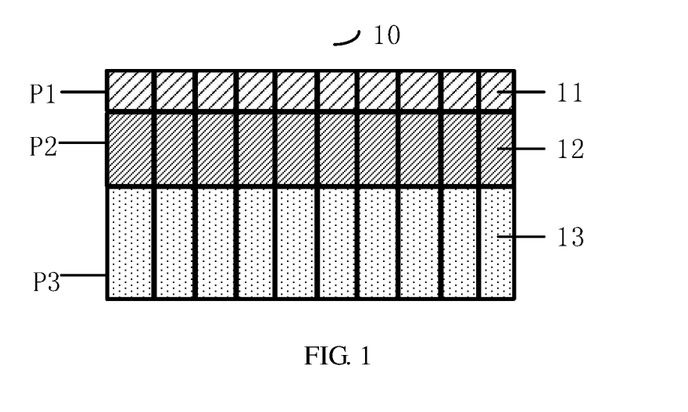
FIG. 1 is a schematic structural plan view of an array substrate.

The service life and the luminous efficiency of the red, green and blue light emitting layers are generally different. For example, the service life and the luminous efficiency of the red light emitting layer and the blue light emitting layer are generally lower than the service life and the luminous efficiency of the green light emitting layer. In order to make the luminous intensity of the plurality of sub-pixels in the OLED display panel be substantially the same, for example, a plurality of sub-pixels of the OLED array substrate are generally designed to have different areas. A luminescent material having a relatively short service life and a relatively low luminous efficiency can be formed in a sub-pixel having a relatively large area, and a luminescent material having a relatively long service life and a relatively high luminous efficiency can be formed in a sub-pixel having a relatively small area, so that luminous intensities of the plurality of sub-pixels in the OLED display panel can be substantially the same. For example, as shown in FIG. 1, an OLED array substrate 10 includes three kinds of sub-pixels, which are, for example, first sub-pixels P1, second sub-pixels P2 and third sub-pixels P3 respectively. As shown in FIG. 1, among the three kinds of sub-pixels, the area of the first sub-pixel P1 is the smallest; the area of the third sub-pixel P3 is the largest; and the area of the second sub-pixel P2 is between the area of the first sub-pixel P1 and the third sub-pixel P3. For example, a green light emitting layer 11 may be formed by inkjet printing in the first sub-pixel P1; a red light emitting layer 12 may be formed by inkjet printing in the second sub-pixel P2; and a blue light emitting layer 13 may be formed by inkjet printing in the third sub-pixel P3. Thus, the luminous intensities of the sub-pixels in the display panel including the array substrate 10 can be substantially the same.

However, in the above array substrate 10, because the areas of different sub-pixels are different from each other, and concentrations of the solutions printed in different sub-pixels may also be different. Thus, upon different kinds of solutions required for preparing films being injected into corresponding sub-pixels by using an inkjet device; the solvent volumes in the solutions in different kinds of sub-pixels may also be different. Therefore, upon the solutions of the sub-pixels in the array substrate being simultaneously dried to form the desired films under the same conditions, the evaporation capacities of the solvent in the different sub-pixels are different, thereby affecting the thickness uniformity of the films, further affecting the display effect of a display product including the array substrate.

In the inkjet printing method of the array substrate provided by at least one embodiment of the present disclosure, the array substrate includes n kinds of sub-pixels; the solvent volumes of the solutions required for inkjet printing of the n kinds of sub-pixels are different; and n is a positive integer greater than or equal to 2. The inkjet printing method includes: recording a solvent volume required for inkjet printing of an i-th kind of sub-pixel as Vi, in which i is a positive integer less than or equal to n; calculating an Xi value for each kind of the n kinds of sub-pixels, in which Xi=Vi/V1, and V1 refers to a solvent volume required for inkjet printing of a first sub-pixel; taking a greatest common divisor of the Xi values of the n kinds of sub-pixels and recording it as G; and dividing the i-th kind of sub-pixel into Xi/G subunits with equal areas, and performing inkjet printing on each of the subunits of the i-th kind of sub-pixel with a solvent volume of V1*G to form a film layer, in which upon the value of Xi/G being greater than or equal to 2, two adjacent subunits of the i-th kind of sub-pixel are separated from each other.

In the inkjet printing method of the array substrate provided by the embodiment, the i-th kind of sub-pixel is divided into the Xi/G subunits with equal areas, and each of the subunits of the i-th kind of sub-pixel is subjected to inkjet printing with the solvent volume of V1*G, so that the solvent volume accommodated in each of subunits of the n kinds of sub-pixels of the array substrate can be same. Upon the solutions of the n kinds of sub-pixels of the array substrate being simultaneously dried to evaporate the solvents to form the desired films, at the same time, the evaporation capacities of the solvent required by the subunits of the array substrate are the same, thereby improving the thickness uniformity of the films and improving the display effect of a display product including the array substrate.

The present disclosure is described below with reference to several specific embodiments. In order to keep the following description of the embodiments of the present disclosure clear and concise, detailed description of known functions and known components can be omitted. Upon any component of the embodiment of the present disclosure appearing in more than one drawing, the component may be represented by the same reference numeral in each drawing.

Figure 2A:
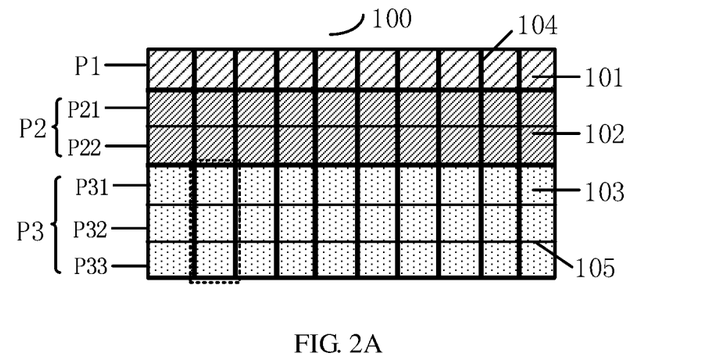
FIG. 2A is a schematic structural plan view of an array substrate formed by an inkjet printing method provided by an embodiment of the present disclosure.
Figure 2B:
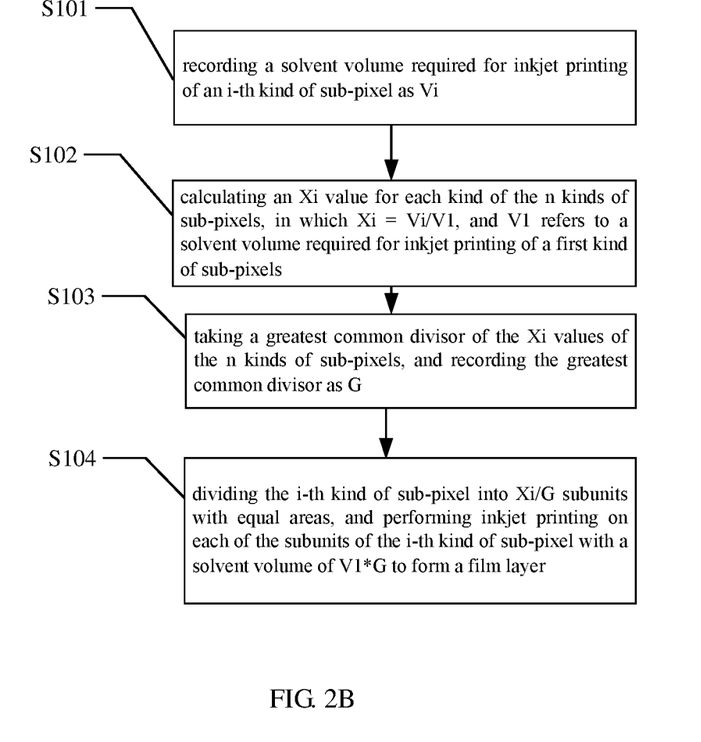
FIG. 2B is a flowchart of an inkjet printing method of an array substrate, provided by an embodiment of the present disclosure.

FIG. 2A is a schematic structural plan view of an array substrate 100 formed by an inkjet printing method provided by the present embodiment. FIG. 2B is a flowchart of an inkjet printing method of an array substrate provided by the present embodiment. Detailed description will be given below to the inkjet printing method of the array substrate with reference to FIGS. 2A and 2B.

The array substrate 100 may be various kinds of array substrates, and no specific limitation will be given here in the present embodiment. Description is given in the embodiment by taking a case that the array substrate 100 is an OLED array substrate as an example. In the present embodiment, the array substrate 100 includes n kinds of sub-pixels, and the solvent volumes required for inkjet printing of the n kinds of sub-pixels are different, in which n is a positive integer greater than or equal to 2. In the embodiment, the "solvent volume" refers to the volume of the solvent. For example, the above-mentioned "the solvent volumes required for inkjet printing of the n kinds of sub-pixels are different" refers to that the volumes of the solvents required for inkjet printing of the n kinds of sub-pixels are different. The n kinds of sub-pixels here are divided according to the solvent volume of the solution for inkjet printing of each kind of n kinds of sub-pixels. Each kind of the n kinds of sub-pixels may include a plurality of sub-pixels, that is, a plurality of sub-pixels having the same solvent volume.

For example, as shown in FIG. 2A, description is given in the embodiment by taking a case that the value of n is equal to 3, namely the array substrate 100 includes three kinds of sub-pixels, as an example. Of course, the value of n includes but is not limited to 3, as long as n is a positive integer greater than or equal to 2. No specific limitation will be given here in the embodiment. For example, as shown in FIG. 2A, the array substrate 100 includes a pixel define layer (PDL) 104. The pixel define layer 104 defines a display area of the array substrate to form a plurality of sub-pixels arranged in an array. As shown in FIG. 2A, the array substrate 100 includes three kinds of sub-pixels which are respectively first sub-pixels P1, second sub-pixels P2 and third sub-pixels P3. For example, three kinds of film layers are respectively formed in the above three kinds of sub-pixels by the inkjet printing method. A first film layer 101 is formed in the first sub-pixel P1; a second film layer 102 is formed in the second sub-pixel P2; and a third film layer 103 is formed in the third sub-pixel P3. For example, an area of the first film layer 101 in the first sub-pixel P1 is recorded as S1, and the volume of the solvent for preparing the first film layer 101 is recorded as V1; an area of the second film layer 102 in the second sub-pixel P2 is recorded as S2, and the volume of the solvent for preparing the second film layer 102 is recorded as V2; and an area of the third film layer 103 in the third sub-pixel P3 is recorded as S3, and the volume of the solvent for preparing the third film layer 103 is recorded as V3. For example, in the present embodiment, the solvent volume is positively related to the area of the film layer, that is, in the case where S1<S2<S3, V1<V2<V3. For example, for the convenient description of the inkjet printing method of the array substrate, description is given in the present embodiment with reference to FIG. 2A by taking a case that S1=1.0, S2=2.0, S3=3.0, V1=2.0, V2=4.0 and V3=6.0 as an example. Of course, the values of S1, S2 and S3 and/or the values of V1, V2 and V3 may be any value. No specific limitation will be given here in the present embodiment.

For example, FIG. 2B is a flowchart of an inkjet printing method of an array substrate. Taking an array substrate 100 as shown in FIG. 2A formed by inkjet printing as an example, the inkjet printing method includes the following steps:

S101: recording a solvent volume required for inkjet printing of an i-th kind of sub-pixel as Vi.

For example, in the present embodiment, i may be any positive integer less than or equal to 3. For example, i may be 1, 2 or 3 respectively. The solvent volume required for inkjet printing of the first sub-pixel P1 is recorded as V1; the solvent volume required for inkjet printing of the second sub-pixel P2 is recorded as V2; and the solvent volume required for inkjet printing of the third sub-pixel P3 is recorded as V3. For example, in one example, the solution volume required for inkjet printing of the i-th kind of sub-pixel is recorded as Ci; the volume concentration of the solution required for inkjet printing of the i-th kind of sub-pixel is recorded as Bi; and Vi=Ci*(1−Bi). For example, the solvent volume of the first sub-pixel P1 is V1=C1*(1−B1); the solvent volume of the second sub-pixel P2 is V2=C2*(1−B2); and the solvent volume of the third sub-pixel P3 is V3=C3*(1−B3). For example, the values of B1, B2 and B3 may be completely the same and may also be completely different. No specific limitation will be given in the present embodiment to the values of B1, B2 and B3. For example, upon B1=B2=B3, V1:V2:V3=C1:C2:C3.

S102: calculating an Xi value for each kind of the n kinds of sub-pixels, in which Xi=Vi/V1.

For example, after the values of V1=2.0, V2=4.0 and V3=6.0 are substituted into Xi=Vi/V1, X1=V1/V1=1.0, X2=V2/V1=2.0 and X3=V3/V1=3 0.0 can be respectively obtained.

S103: taking a greatest common divisor of the Xi values of the n kinds of sub-pixels and recording the greatest common divisor as G.

For example, the greatest common divisor of X1 (1.0), X2 (2.0) and X3 (3.0) is G=1.0. It should be noted that in the present embodiment of the present disclosure, the greatest common divisor refers not only to the largest divisor among the divisors of two or more natural numbers, but the definition of the greatest common divisor can also be expanded to fraction (decimal). For example, upon the Xi values of the n kinds of sub-pixels at least include one fraction (decimal), the Xi values of the n kinds of sub-pixels are respectively divided by their greatest common divisor to make the corresponding Xi value integral. Upon the Xi value of the n kinds of sub-pixels at least including one fraction (decimal), the calculating method of the greatest common divisor, for example, may be: (1) writing the Xi values of the n kinds of sub-pixels in a fractional form, for example, Xi=Fi/Ei; (2) recording the least common multiple of the denominator Ei of Xi of the n kinds of sub-pixels as a; (3) recording the greatest common divisor of the numerator Fi of Xi of the n kinds of sub-pixels as b; and (4) recording the greatest common divisor of the Xi value of the n kinds of sub-pixels as G=b/a. For example, as X1=V1/V1=1, upon the Xi values of the n kinds of sub-pixels being all positive integer, the greatest common divisor G of the Xi values of the n kinds of sub-pixels is equal to 1; and upon at least one of the Xi values of the n kinds of sub-pixels being a fraction (decimal), the greatest common divisor of the Xi values of the n kinds of sub-pixels is G=b/a.

For example, in one example, upon the Xi value being a decimal (converting fraction to decimal) and the number of digits after the decimal point of the decimal being greater than or equal to 2, one decimal number is reserved for the Xi value by a rounding-off method at first, and then the Xi value obtained after one decimal is retained, and is written in a fractional form, and finally the greatest common divisor G of the Xi values of the n kinds of sub-pixels is calculated by the above method (G=b/a).

For example, in one example, after the steps S101 and S102, the obtained values of Xi(i=1, 2, 3) are, For example, respectively X1=1.01, X2=1.2 and X3=1.3; and if one decimal is not retained for X1 by a rounding-off method, the greatest common divisor of X1(1.01), X2(1.2) and X3(1.3) is G=0.01. After the values of X1(1.01), X2(1.2), X3(1.3) and G(0.01) are substituted into Xi/G in the following step S104, X1/G=101, X2/G=120 and X3/G=130 can be respectively obtained. That is to say, the first sub-pixel P1 must be divided into 101 subunits with equal areas; the second sub-pixel P2 is divided into 120 subunits with equal areas; and the third sub-pixel P3 is divided into 130 subunits with equal areas. Before the step of calculating the greatest common divisor G of X1(1.01), X2(1.2) and X3(1.3), one decimal is retained for the value of X1(1.01) by a rounding-off method to convert the value of X1 into X1'=1.0 at first, and then the greatest common divisor G of X1'=1.0, X2(1.2) and X3(1.3) is calculated. In this case, the greatest common divisor of X1'=1.0, X2(1.2) and X3(1.3) is G=0.1. After the values of X1'=1.0, X2(1.2), X3(1.3) and G(0.1) are substituted into Xi/G in the following step S104, X1'/G=10, X2/G=12 and X3/G=13 can be respectively obtained. That is to say, the first sub-pixel P1 is divided into 10 subunits with equal areas; the second sub-pixel P2 is divided into 12 subunits with equal areas; and the third sub-pixel P3 is divided into 13 subunits with equal areas. Thus, the solvent volume required by a plurality of subunits of each kind of sub-pixels can be basically the same. Meanwhile, the number of the divided subunits of each kind of sub-pixels is not too large, which is beneficial to the operation in the actual process.

S104: dividing the i-th kind of sub-pixel into Xi/G subunits with equal areas, and performing inkjet printing on each of the subunits of the i-th kind of sub-pixel with the solvent volume of V1*G. In this step, as for the i-th kind of sub-pixel, a solution including V1*G solvent is inkjet-printed on each of the subunits of the i-th kind of sub-pixel.

For example, after the Xi values and the G value respectively calculated in the steps S102 and S103 are substituted into corresponding formula in this step, the following can be obtained: the first sub-pixel P1 includes one subunit, that is, the first sub-pixel P1 is not divided, and the first sub-pixel P1 is subjected to inkjet printing with the solvent volume of 1.0(V1*G, V1=1.0, G=1.0) to form a first film layer 101; the second sub-pixel P2 is divided into two subunits with equal areas which are respectively P21 and P22, and P21 and P22 are respectively subjected to inkjet printing with the solvent volume of 1.0(V1*G, V1=1.0, G=1.0) to form a second film layer 102 in P21 and P22; and the third sub-pixel P3 is divided into three subunits with equal areas which are respectively P31, P32 and P33, and P31, P32 and P33 are respectively subjected to inkjet printing with the solvent volume of 1.0(V1*G, V1=1.0, G=1.0) to form a third film layer 103 in P31, P32 and P33. It should be noted that the areas of a plurality of subunits in each kind of the n kinds of sub-pixels are mutually the same. The areas of the subunits of different kinds of sub-pixels may be same or different, and no specific limitation will be given here in the present embodiment. For example, the area of P21 is the same with the area of P22, but the area of P21 and the area of P31 may be same or different. It should be noted that the meaning of "same" here includes exactly the same and roughly the same.

For example, the first film layer 101, the second film layer 102 and the third film layer 103 may be an organic functional layer in an OLED array substrate 100. The organic functional layer, For example, may be any layer selected from a group consisting of a light emitting layer, an electron transport layer, an electron injection layer, a hole transport layer and a hole injection layer, or any combination thereof. No specific limitation will be given here in the present embodiment. For example, in one example, upon the first film layer 101, the second film layer 102 and the third film layer 103 being all light emitting layers, the first film layer 101 may be a green light emitting layer, the second film layer 102 being a red light emitting layer, the third film layer 103 being a blue light emitting layer. Thus, a display panel including the array substrate 100 can realize color display. As the service life and the luminous efficiency of the red light emitting layer and the blue light emitting layer are usually lower than the service life and the luminous efficiency of the green light emitting layer, the green light emitting layer with high service life and high luminous efficiency is formed in the first sub-pixel P1 with small area and the blue light emitting layer with low service life and low luminous efficiency is formed in the third sub-pixel P3 with large area, so the luminous intensity of each sub-pixel in a display device including the array substrate can be basically the same, and then the brightness uniformity of the display device can be improved.

It should be noted that, in the process of "performing inkjet printing on each of the subunits of the i-th kind of sub-pixel with the solvent volume of V1*G to form the film layer" in the step S104, after the solutions required for film forming are printed on the subunits of the n kinds of sub-pixels of the array substrate, it is usually needed to simultaneously dry the solutions of the n kinds of sub-pixels of the array substrate to remove the solvents in the solutions to form the film layers, and the drying method, for example, includes vacuum drying, rotary drying or any appropriate drying method. For example, the array substrate printed with the solution may be placed in a vacuum dryer, and the solvent in the solution is evaporated by vacuum drying method to form the film layer. Or, the array substrate printed with the solution may be placed on a rotary base, and the solvent is evaporated to form the film layer by rotating the array substrate printed with the solution. The rotary drying method, for example, includes at least one of vacuum rotary drying or heating rotary drying. For example, parameters such as temperature, pressure intensity and rotary speed required for drying can be correspondingly adjusted according to product design demands No specific limitation will be given here in the present embodiment.

Figure 3A:
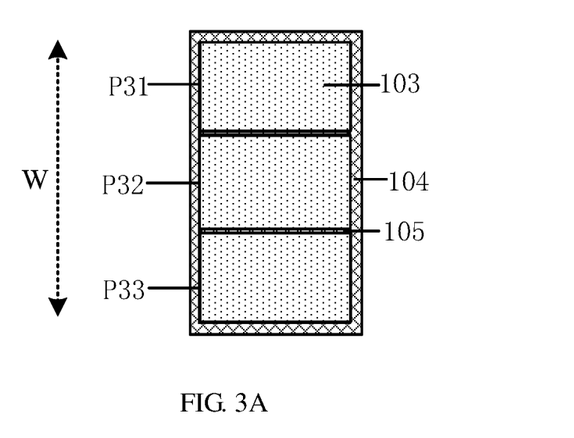
FIG. 3A is a schematic partial enlarged view of components in a dashed line box in FIG. 2A.

For example, upon the value of Xi/G being greater than or equal to 2, two adjacent subunits of the i-th kind of sub-pixel are separated from each other. For example, before the step of performing the inkjet printing on each kind of the n kinds of sub-pixels to form the film layer, a pixel define layer 104 and a unit define layer 105 must be formed on a base substrate of the array substrate 100 in advance to allow the solution for inkjet printing to accurately flow into the plurality of subunits in each kind of sub-pixel, and allow the solvent volume in each subunit to be same. For example, FIG. 3A is a schematic enlarged view of a dashed line box in FIG. 2A. As shown in FIG. 3A, the unit define layer 105 is disposed in the third sub-pixel P3 to define subunits P31, P32 and P33, so that the subunits P31, P32 and P33 can be separated from each other. As shown in FIG. 3A, an interval between two adjacent subunits in the third sub-pixel P3 is not greater than an interval between two adjacent sub-pixels in the three kinds of sub-pixels. That is to say, in the W direction as shown in FIG. 3A, the line width of the unit define layer 105 is less than or equal to the line width of the pixel define layer 104, so the display image of the display device including the array substrate formed by the inkjet printing method will not have granular sensation. For example, the unit define layer 105 and the pixel define layer 104 may be integrally formed and may also be mutually independent structures, and no specific limitation will be given here in the present embodiment. For example, the material of the unit define layer 105 may be the same with the material of the pixel define layer 104. The example of the material of the unit define layer 105 and the pixel define layer 104 includes organic insulating material or inorganic insulating material. The organic insulating material includes one or more selected from the group consisting of polyimide, polyamide, acrylic resin and phenolic resin, and no specific limitation will be given here in the present embodiment. It should be noted that FIG. 3A is only a schematic example and does not represent the actual line width proportion of the unit define layer 105 and the pixel define layer 104 in the W direction. The actual line width of the unit define layer 105 and the pixel define layer 104 in the W direction can be correspondingly adjusted according to product design demands, and no specific limitation will be given here in the present embodiment.

Figure 3B:
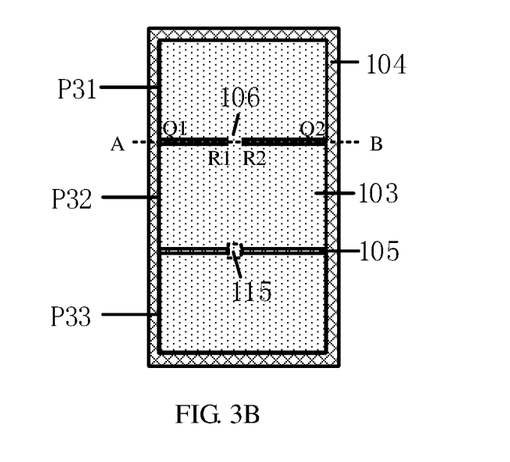
FIG. 3B is a schematic partial enlarged view of an array substrate provided by an example of an embodiment of the present disclosure.

For example, in another example of the present embodiment, upon the value of Xi/G being greater than or equal to 2, a channel for connecting two adjacent subunits may also be disposed between the two adjacent subunits of the i-th kind of sub-pixel. For example, FIG. 3B is a schematic partial enlarged view of the third sub-pixel of another array substrate. As shown in FIG. 3B, a channel 106 for connecting two adjacent subunits is disposed between two adjacent subunits of the third sub-pixel P3. For example, an opening of the unit define layer 105 may form the channel 106. For example, in the direction perpendicular to the arrangement direction of the two adjacent subunits, the size of the channel 106 is less than the size of the subunit. As shown in FIG. 3B, two intersections of the AB line and two sides of the subunit are Q1 and Q2 respectively, and two intersections of the AB line and the channel 106 are respectively R1 and R2, so "in a direction perpendicular to the arrangement direction of the two adjacent subunits, the size of the channel 106 is less than the size of the subunit" refers to that the length of R1R2 is less than that of Q1Q2. For example, in one example, the length of R1R2 is much smaller than the length of Q1Q2. Therefore, the solvent volume of the solvent in each of the subunits flowing into an adjacent subunit through the channel 106 can be basically ignored, so the solvent volume in the plurality of subunits of each kind of sub-pixel can be basically the same. In addition, as shown in FIG. 3B, the solution in the first subunit P31 may be communicated with the solution in the second subunit P32 through the channel 106; the solution in the second subunit P32 may be communicated with the solution in the third subunit P33 through the channel 106; at least part of the solution will not be separated at the position of the unit define layer 105; and then the granular sensation of the display image of the display device formed by inkjet printing method can be further avoided. For example, FIG. 3B shows that only one channel 106 is formed between two adjacent subunits in each kind of sub-pixel, but the example includes but not limited thereto. For example, two or more channels 106 may also be formed between two adjacent subunits in each kind of sub-pixel as required, and no specific limitation will be given here in the example.

It should be noted that, for clarity, not all the structures of the array substrate 100 formed by the inkjet printing method are shown in the accompanying drawings. In order to realize necessary functions of the array substrate, other structures not shown can be arranged by those skilled in the art according to specific application scenes. No limitation will be given here in the present embodiment of the present disclosure.

In the inkjet printing method of the array substrate provided by at least one embodiment of the present disclosure, the i-th kind of sub-pixel is divided into $X_i/G$ subunits with equal areas, and each of subunits of the i-th kind of sub-pixel is subjected to inkjet printing with the solvent volume of $V_1*G$, so that the solvent volume in the subunits of the array substrate can be same. Thus, upon the solutions of the n kinds of sub-pixels of the array substrate being simultaneously dried to form the required films, under same conditions, the evaporation capacities of the solvents of the required solutions of the subunits in each kind of sub-pixel of the array substrate are the same, thereby improving the thickness uniformity of the film and improving the display effect of the display device including the array substrate. Meanwhile, the inkjet printing method is simple in operation and easy to realize.

For example, in one example, in the n kinds of sub-pixels of the array substrate, areas of the film layers of at least two kinds of sub-pixels are different, and the solvent volumes $V_i$ for forming the film layers of the two kinds of sub-pixels with different areas are negatively related to the area $S_i$. For example, the area of the film layer of the first sub-pixel is recorded as S1, and the solvent volume for forming the film layer is recorded as V1; the area of the film layer of the second sub-pixel is recorded as S2, and the solvent volume for forming the film layer is recorded as V2; and upon S1<S2, V1>V2.

Figure 4:
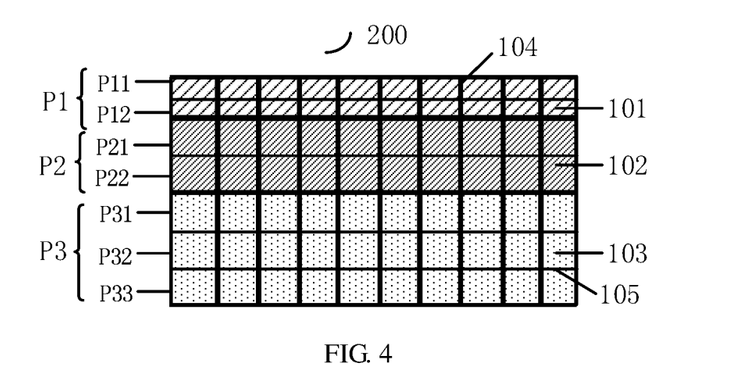
FIG. 4 is a schematic structural plan view of an array substrate formed by an inkjet printing method provided by a first example of another embodiment of the present disclosure.

FIG. 4 is a schematic structural plan view of another array substrate 200 formed by inkjet printing method provided by the present embodiment. The inkjet printing method may refer to the method as shown in FIG. 2B. As shown in FIG. 4, except that the number of the divided subunits of the first sub-pixel P1 of the array substrate 200 as shown in FIG. 4 is different from that as shown in FIG. 2A, the structure of the array substrate 200 provided by the present embodiment and the structure of the array substrate 100 as shown in FIG. 2A can be basically the same. In order to conveniently describe the inkjet printing method of the array substrate, in the present embodiment, S1=1.0, S2=2.0, S3=3.0, V1=2.0, V2=3.0, V3=3.0. Description will be given below to the inkjet printing method of the array substrate 200 with reference to FIG. 2B.

S101: recording the solvent volume required for inkjet printing of the i-th kind of sub-pixel as $V_i$.

For example, in the present embodiment, i may be any positive integer less than or equal to 3. For example, i may be 1, 2 and 3 respectively. V1=2.0, V2=3.0, V3=3.0.

S102: calculating an $X_i$ value for each kind of the n kinds of sub-pixels, in which $X_i=V_i/V_1$.

For example, after the values of $V_i$ in the step S101 are substituted into $X_i=V_i/V_1$, X1=V1/V1=1.0, X2=V2/V1=1.5 and X3=V3/V1=1.5 can be respectively obtained.

S103: taking a greatest common divisor of the $X_i$ values of the n kinds of sub-pixels and recording the greatest common divisor as G.

For example, the greatest common divisor of X1=1.0, X2=1.5 and X3=1.5 is G=0.5.

S104: dividing the i-th kind of sub-pixel into $X_i/G$ subunits with equal areas, and performing inkjet printing on each of the subunits of the i-th kind of sub-pixel with a solvent volume of $V_1*G$. In this step, as for the i-th kind of sub-pixel, a solution including $V_1*G$ solvent is inkjet-printed on each of the subunits of the i-th kind of sub-pixel.

For example, after the $X_i$ value and the G value respectively calculated in the steps S102 and S103 are substituted into corresponding formula in the step, the following can be obtained: averagely dividing the first sub-pixel P1 into two subunits which are respectively P11 and P12, and performing inkjet printing on the two subunits P11 and P12 respectively with the solvent volume of 1.0(V1*G, V1=2.0, G=0.5) to form a first film layer 101, in which the first film layer 101, for example, may be a green light emitting layer; averagely dividing the second sub-pixel P2 into two subunits which are P21 and P22 respectively, and performing inkjet printing on the two subunits P21 and P22 respectively with the solvent volume of 1.0(V1*G, V1=2.0, G=0.5) to form a second film layer 102, in which the second film layer 102, for example, may be a red light emitting layer; and dividing the third sub-pixel P3 into three subunits with equal area which are respectively P31, P32 and P33, and performing inkjet printing on P31, P32 and P33 respectively with the solvent volume of 1.0(V1*G, V1=2.0, G=0.5) to form a third film layer 103 in P31, P32 and P33, in which the third film layer 103, for example, may be a blue light emitting layer.

The array substrate 200 may be formed by the above inkjet printing method. As can be seen from the present embodiment, although the area of each kind of sub-pixel as shown in FIG. 4 is the same with the area of each kind of sub-pixel as shown in FIG. 2A, the solvent volume in each kind of sub-pixel is changed. Thus, compared with the array substrate 100 as shown in FIG. 2A, the number of the divided subunits of each kind of sub-pixel of the array substrate 200 as shown in FIG. 4 also changes to a certain degree, and the solvent volume for inkjet printing of each of the subunits in each kind of sub-pixel also changes. In the present embodiment, each of the subunits in the three kinds of sub-pixels is subjected to inkjet printing with the solvent volume of 1.0(V1*G, V1=2.0, G=0.5) to form corresponding film layer. Under same conditions, the evaporation capacities of the solvent of the subunits in each kind of sub-pixel of the array substrate are the same, so as to form the film with uniform thickness and improve the display effect of the display device including the array substrate. Meanwhile, the inkjet printing method is simple in operation and easy to realize.

Figure 5:
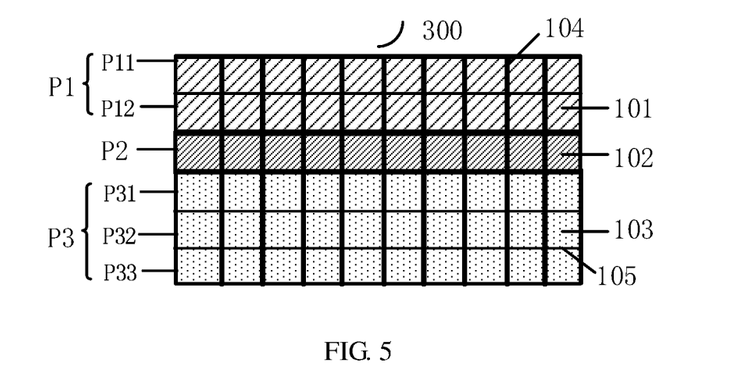
FIG. 5 is a schematic structural plan view of another array substrate formed by an inkjet printing method provided by a second example of another embodiment of the present disclosure.

FIG. 5 is a schematic structural plan view of another array substrate 300 formed by inkjet printing method provided by another example of the present embodiment. The inkjet printing method may refer to the method as shown in FIG.

2B. As shown in FIG. 5, except that the area S1 of the first sub-pixel P1, the area S2 of the second sub-pixel P2, and the number of corresponding subunits of the array substrate 300 as shown in FIG. 5 are different from those as shown in FIG. 2A, the structure of the array substrate 300 in this example and the structure of the array substrate 100 may be basically the same. In the array substrate 300 provided by the example, S1=2.0, S2=1.0, S3=3.0, V1=4.0, V2=2.0, V3=6.0. Description will be given below to the inkjet printing method of the array substrate 300 with reference to FIG. 2B.

S101: recording a solvent volume required for inkjet printing of an i-th kind of sub-pixel as Vi.

For example, in the present embodiment, i may be any positive integer less than or equal to 3. For example, i may be 1, 2 and 3 respectively. For example, V1=4.0, V2=2.0, V3=6.0.

S102: calculating an Xi value for each kind of the n kinds of sub-pixels, in which Xi=Vi/V1.

For example, after the values of Vi in the step S101 are substituted into Xi=Vi/V1, X1=V1/V1=1.0, X2=V2/V1=0.5 and X3=V3/V1=1.5 can be respectively obtained.

S103: taking a greatest common divisor of the Xi values of n kinds of sub-pixels and recording greatest common divisor as G.

For example, the greatest common divisor of X1=1.0, X2=0.5 and X3=1.5 is G=0.5.

S104: dividing the i-th kind of sub-pixel into Xi/G units with equal areas, and performing inkjet printing on each of the subunits of the i-th kind of sub-pixel with the solvent volume of V1*G. In this step, as for the i-th kind of sub-pixel, a solution including V1*G solvent is inkjet-printed on each of the subunits of the i-th kind of sub-pixel.

For example, after the Xi value and the G value respectively calculated in the steps S102 and S103 are substituted into corresponding formula in this step, the following can be obtained: the first sub-pixels P1 is divided into two subunits with equal areas which are respectively P11 and P12, and the two subunits P11 and P12 are respectively subjected to inkjet printing with the solvent volume of 2.0(V1*G, V1=4.0, G=0.5) to form a first film layer 101; the first film layer 101, for example, may be a red light emitting layer; the second sub-pixel P2 is one subunit, that is, the second sub-pixel P2 is not required to be divided; the second sub-pixel P2 is subjected to inkjet printing with the solvent volume of 2 to form a second film layer 102; the second film layer 102, for example, may be a green light emitting layer; the third sub-pixel P3 is divided into three subunits with equal area which are respectively P31, P32 and P33; P31, P32 and P33 are respectively subjected to inkjet printing with the solvent volume of 2.0(V1*G, V1=4.0, G=0.5) to form a third film layer 103 in P31, P32 and P33; and the third film layer 103, for example, may be a blue light emitting layer.

Compared with the array substrate 100 as shown in FIG. 2A, the first sub-pixel of the array substrate 300 provided by the present embodiment is equivalent to the second sub-pixel of the array substrate 100; the second sub-pixel of the array substrate 300 is equivalent to the first sub-pixel of the array substrate 100; and the third sub-pixel of the array substrate 300 is equivalent to the third sub-pixel of the array substrate 100. Compared with FIG. 2A, although the present embodiment does not use a sub-pixel requiring the smallest solvent volume as a calculation reference, the number of the divided subunits of each kind of sub-pixel and the solvent volume printed on each subunit are the same with those as shown in FIG. 2A. Therefore, in the inkjet printing method of the array substrate provided by the present embodiments of the present disclosure, the subunit requiring the smallest solvent volume of the array substrate is not required to be taken as the first sub-pixel, and the first sub-pixel may be any kind of sub-pixel in the array substrate.

Figure 6:
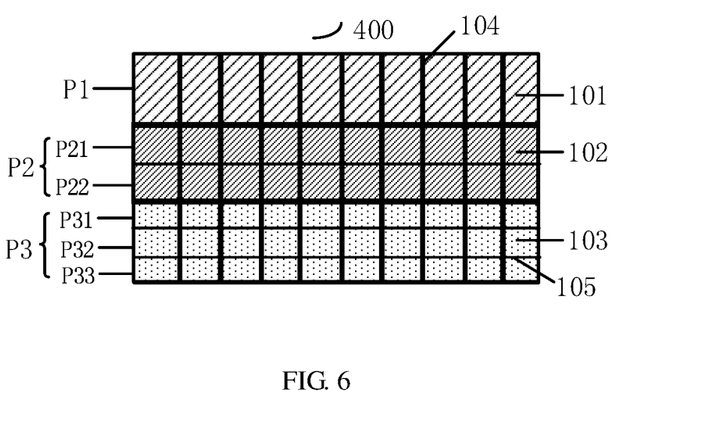
FIG. 6 is a schematic structural plan view of still another array substrate formed by an inkjet printing method provided by a third example of another embodiment of the present disclosure.

FIG. 6 is a schematic structural plan view of still another array substrate formed by inkjet printing method provided by still another example of the present embodiment. The inkjet printing method may refer to the method as shown in FIG. 2B. As shown in FIG. 6, in the array substrate 400 provided by the example, S1=S2=S3=1.0, V1=2.0, V2=4.0, V3=6.0. Description will be given below to the inkjet printing method of the array substrate 400 with reference to FIG. 2B.

S101: recording an solvent volume for inkjet printing of an i-th kind of sub-pixel as Vi.

For example, in the present embodiment, i may be any positive integer less than or equal to 3. For example, i may be 1, 2 and 3 respectively. For example, V1=2.0, V2=4.0, V3=6.0.

S102: calculating an Xi value for each kind of the n kinds of sub-pixels, in which Xi=Vi/V1.

For example, after the values of Vi in the step S101 are substituted into Xi=Vi/V1, X1=V1/V1=1.0, X2=V2/V1=2.0 and X3=V3/V1=3.0 can be respectively obtained.

S103: taking a greatest common divisor of the Xi values of n kinds of sub-pixels and recording the greatest common divisor as G.

For example, the greatest common divisor of X1=1.0, X2=2.0 and X3=3.0 is G=1.0.

S104: dividing the i-th kind of sub-pixel into Xi/G subunits with equal areas, and performing inkjet printing on each of the subunits of the i-th kind of sub-pixel with the solvent volume of V1*G. In this step, as for the i-th kind of sub-pixel, a solution including V1*G solvent is inkjet-printed on each of the subunits of the i-th kind of sub-pixel.

For example, after the Xi value and the G value respectively calculated in the steps S102 and S103 are substituted into corresponding formula in this step, the following can be obtained: the first sub-pixel P1 includes one subunit, that is, the first sub-pixel P1 is not required to be divided; the first sub-pixel P1 is subjected to inkjet printing with the solvent volume of 2.0(V1*G, V1=2.0, G=1.0)) to form a first film layer 101; the second sub-pixel P2 is averagely divided into two subunits with equal area which are respectively P21 and P22, and the two subunits P21 and P22 are respectively subjected to inkjet printing with the solvent volume of 2.0(V1*G, V1=2.0, G=1.0) to form a second film layer 102; and the third sub-pixel P3 is divided into three subunits with equal area which are respectively P31, P32 and P33, and P31, P32 and P33 are respectively subjected to inkjet printing with the solvent volume of 2.0(V1*G, V1=2.0, G=1.0) to form a third film layer 103 in P31, P32 and P33.

Although the areas of the three kinds of sub-pixels of the array substrate 400 are all equal, due to different solvent volumes in each kind of the n kinds of sub-pixels, if each kind of the n kinds of sub-pixels of the array substrate is not divided into corresponding number of subunits, in the process of evaporating the solvent to form the film layer, the thickness uniformity of the formed film layer can be easily affected. By adoption of the inkjet printing method of the array substrate provided by the example, the second sub-pixel P2 of the array substrate 400 is divided into two subunits with equal areas; the third sub-pixel P3 is divided into three subunits with equal areas; and each of the subunits is subjected to inkjet printing with the solvent volume of 2.0(V1*G, V1=2.0, G=1.0). Under same conditions, the evaporation capacities of the solvents of the subunits in each kind of sub-pixel of the array substrate are the same, so as to form the film with uniform thickness and improve the display effect of the display device including the array substrate. Meanwhile, the inkjet printing method is simple in operation and easy to realize.

Figure 7:
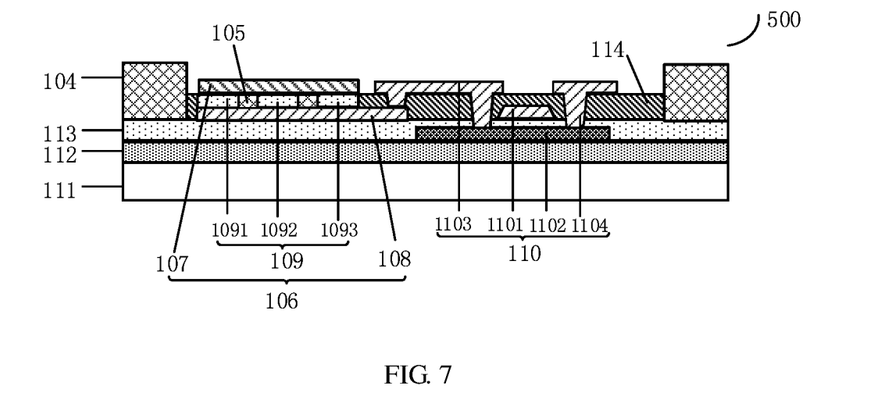
FIG. 7 is a schematic structural sectional view of an array substrate provided by still another embodiment of the present disclosure.

The present embodiment provides an array substrate 500, which includes n kinds of sub-pixels arranged in an array, in which n is a positive integer greater than or equal to 2. FIG. 7 is a schematic structural partial sectional view of one kind of sub-pixel of the array substrate 500 provided by the present embodiment. The n kinds of sub-pixels herein are divided according to the solvent volume of the solution required for inkjet printing of each kind of the n kinds of sub-pixels, that is, the solvent volumes of the solutions required for inkjet printing of the n kinds of sub-pixels are mutually different. For example, each kind of the n kinds of sub-pixels may include a plurality of sub-pixels, namely each kind of sub-pixels may include a plurality of sub-pixels requiring same solvent volume for inkjet printing. For example, the array substrate 500 may be any suitable type of array substrate, and the specific type of the array substrate is not limited in the present embodiment.

As shown in FIG. 7, description is given in the present embodiment by taking the case that the array substrate 500 is an array substrate of an OLED display device as an example. The array substrate 500 includes structures such as a base substrate 111, a pixel define layer 104, a luminous element 106, a unit define layer 105 and a thin film transistor 110, in which at least one film layer of the luminous element 106 includes a plurality of mutually separated subparts.

For example, as shown in FIG. 7, the base substrate 111, for example, may be a glass substrate, a quartz substrate, a plastic substrate or a substrate of any suitable material. No specific limitation will be given here in the present embodiment.

For example, as shown in FIG. 7, the pixel define layer 104 is disposed on the base substrate 111 and configured to define a plurality of sub-pixels of the array substrate 500. As shown in FIG. 7, the pixel define layer 104 includes an opening which is provided with structures such as the luminous element 106 and the thin film transistor 110. For example, the example of the material of the pixel define layer 104 includes organic insulating material or inorganic insulating material. The organic insulating material, for example, includes one or more selected from the group consisting of polyimide, polyamide, acrylic resin and phenolic resin. The material of the pixel define layer 104 is not specifically limited in the present embodiment.

For example, as shown in FIG. 7, the luminous element 106 is an OLED and, for example, includes a counter electrode 107, a pixel electrode 108 and an organic light emitting layer 109 disposed between the counter electrode 107 and the pixel electrode 108. The organic light emitting layer 109, For example, may be formed by the inkjet printing method described in the above embodiment. For example, as shown in FIG. 7, the unit define layer 105 divides the organic light emitting layer 109 into three subparts which are respectively a first subpart 1091, a second subpart 1092 and a third subpart 1093. And in a plane parallel to the array substrate 500, areas of the three subparts are mutually equal. For example, in the process of forming the organic light emitting layer 109 by inkjet printing method, a solution for preparing the organic light emitting layer 109 is respectively inkjet-printed on three subunits of the sub-pixel; the solvent volume of the solution required by the three subunits is same; and the unit define layer 105 defines the three subunits to allow any two adjacent subunits in the three subunits to be mutually separated. After the solvent in the solution in the three subunits is evaporated and dried, the first subpart 1091, the second subpart 1092 and the third subpart 1093 of the organic light emitting layer 109 are correspondingly formed in the three subunits. Because the solvent volumes in the three subunits are the same, under same conditions, the evaporation capacities of the solvents in the solution of the three subunits are the same, so the areas of the three subparts of the formed organic light emitting layer are the same. It should be noted that the area of a plurality of subparts in the same kind of sub-pixel is mutually the same, and the areas of a plurality of subparts in different kinds of sub-pixels may be same or different. No specific limitation will be given here in the present embodiment. For example, an interval between two adjacent subparts is not greater than an interval between two adjacent kinds of sub-pixels, that is, as shown in FIG. 7, the line width of the unit define layer 105 is not greater than the line width of the pixel define layer 104, so the display image of the display device including the array substrate will not have granular sensation. For example, the unit define layer 105 and the pixel define layer 104 may be integrally formed and may also be mutually independent structures. No specific limitation will be given here in the present embodiment. For example, the material of the unit define layer 105 may be the same as the material of the pixel define layer 104. It should be noted that FIG. 7 is only a schematic example and does not represent the actual line width proportion of the unit define layer 105 and the pixel define layer 104, and the actual line width of the unit define layer 105 and the pixel define layer 104 must be correspondingly adjusted according to product design demands. No specific limitation will be given here in the present embodiment. It should be noted that the organic light emitting layer 109 in FIG. 7 only shows three subparts, but the number of the subparts of the organic light emitting layer 109 includes but not limited to three and, for example, may also be one, two or more. No specific limitation will be given here in the present embodiment.

For example, in the sub-pixel including a plurality of subparts, the plurality of subparts (for example, the first subpart 1091, the second subpart 1092 and the third subpart 1093) are electrically connected with the same pixel electrode 108.

For example, in one example, the luminous element 106 may further include one or more selected from a group consisting of a hole transport layer, a hole injection layer, an electron transport layer and an electron injection layer. For example, not only the organic light emitting layer 109 may include a plurality of mutually separated subparts, one or more selected from the group consisting of the hole transport layer, the hole injection layer, the electron transport layer and the electron injection layer may also include a plurality of mutually separated subparts, as long as the unit define layer 105 is adopted to define and separate corresponding film layer to form the plurality of subparts. For example, the plurality of subparts in the hole transport layer, hole injection layer, electron transport layer and the electron injection layer may be formed by the inkjet printing method of the array substrate provided by any foregoing embodiment.

For example, in another example, with reference to FIGS. 3B and 7, upon the third film layer 103 in the third sub-pixel as shown in FIG. 3B being an organic light emitting layer 109, a connecting portion 115 is also disposed between two adjacent subparts of the organic light emitting layer 109, and in a direction perpendicular to the arrangement direction of the two adjacent subparts, the size of the connecting portion 115 is less than the size of the subpart. As shown in FIG. 3B, For example, the connecting part 115 may be a film layer disposed at a position of the channel 106 in the unit define layer 105. For example, the film layer of the connecting part 115 and the organic light emitting layer 109 are integrally formed, that is, the part of the organic light emitting layer 109 at the position of the channel forms the connecting portion 115. For example, the first subpart 1091 and the second subpart 1092 of the organic light emitting layer 109 are integrally formed through the connecting portion 115, and the second subpart 1092 and the third subpart 1093 of the organic light emitting layer 109 are integrally formed through the connecting portion 115, so the organic light emitting layer 109 formed by the first subpart 1091, the second subpart 1092 and the third subpart 1093 forms a continuous film layer, so as to further avoid the granular sensation of the display image of the display device including the array substrate.

For example, as shown in FIG. 7, the counter electrode 107 and the pixel electrode 108 both are a continuous electrode layer. For example, the pixel electrode 108 may be a strip electrode or a planar electrode and is continuously disposed in the n kinds of sub-pixels of the array substrate 500. For example, the material of the counter electrode 107 and the pixel electrode 108 includes transparent conductive material. The transparent conductive material, for example, may be any suitable material such as indium tin oxide (ITO) or indium zinc oxide (IZO). For example, in one example, the counter electrode 107 may be configured to be a common electrode of the array substrate 500. For example, the pixel electrode 108 may be an anode of the luminous element 106, and the counter electrode 107 may be taken as a cathode of the luminous element 106. Of course, the pixel electrode 108 may also be taken as the cathode of the luminous element 106, and the counter electrode 107 may be taken as the anode of the luminous element 106.

For example, as shown in FIG. 7, the TFT 110 includes structures such as a gate electrode 1101, an active layer 1102, a first source/drain electrode 1103 and a second source/drain electrode 1104. As shown in FIG. 7, the pixel electrode 108 is electrically connected with the first source/drain electrode 1103 of the TFT 110.

For example, as shown in FIG. 7, the array substrate 500 further includes structures such as a buffer layer 112, an insulating layer 113 and a planarization layer 114. For example, the buffer layer 112 is disposed between the base substrate 111 and the active layer 1102; the insulating layer 113 and the planarization layer 114 are sequentially superimposed on the buffer layer 112; and the example of the material of the buffer layer 112, the insulating layer 113 and the planarization layer 114 includes SiNx, SiOx or other suitable material. No specific limitation will be given here in the present embodiment.

It should be noted that, for clarity, not all the structures of the array substrate 500 are given in the accompanying drawing. In order to realize necessary functions of the array substrate, other structures not shown may be arranged by those skilled in the art according to specific application scenes. No limitation will be given here in the present embodiment of the present disclosure.

In the array substrate 500 provided by the present embodiment, at least the organic light emitting layer 109 in the organic luminous element 106 includes a plurality of mutually separated subparts with equal area, and the organic light emitting layer 109, For example, may be formed by the inkjet printing method of the array substrate provided by any foregoing embodiment. Other technical effects of the array substrate 500 provided by the present embodiment may refer to the technical effects of the inkjet printing method of the array substrate provided by the above embodiment. No further description will be given here.

For example, an example of the present embodiment further provides a display device, which includes any array substrates provided by the present embodiment. For example, the display device may be a display device such as an OLED display device, or any display product or component such as a television, a digital camera, a mobile phone, a watch, a tablet computer, a notebook computer or a navigator including the display device. The example is not limited thereto. The technical effects of the display device may refer to the technical effects of the array substrate provided by the present embodiment, and details are not described herein again.

The following points should be noted:

(1) The accompanying drawings involve only the structure(s) in connection with the embodiment(s) of the present disclosure, and other structure(s) can be referred to common design(s).

(2) The accompanying drawings in the present embodiments of the present disclosure only involve structures relevant to the present embodiments of the present disclosure, and other structures may refer to the prior art.

(3) For the purpose of clarity only, in accompanying drawings for illustrating the embodiment(s) of the present disclosure, the thicknesses of layers or regions are enlarged or reduced, i.e., these drawings are not drawn to actual scale.

The foregoing is only the present embodiments of the present disclosure and not intended to limit the scope of protection of the present disclosure, alternations or replacements which can be easily envisaged by any skilled person being familiar with the present technical field shall fall into the protection scope of the present disclosure. Thus, the protection scope of the present disclosure should be based on the protection scope of the claims.

What is claimed is:

1. An inkjet printing method of an array substrate, wherein the array substrate comprises n kinds of sub-pixels; solvent volumes of solutions required for inkjet printing of the n kinds of sub-pixels are different; n is a positive integer greater than or equal to 2; and the method comprises:
 recording a solvent volume required for inkjet printing of an i-th kind of sub-pixel as Vi, in which i is a positive integer less than or equal to n;
 calculating an Xi value for each kind of the n kinds of sub-pixels, in which Xi=Vi/V1, and V1 refers to a solvent volume required for inkjet printing of a first kind of sub-pixels;
 taking a greatest common divisor of the Xi values of the n kinds of sub-pixels, and recording the greatest common divisor as G; and
 dividing the i-th kind of sub-pixel into Xi/G subunits with equal areas, and performing inkjet printing on each of the subunits of the i-th kind of sub-pixel with a solvent volume of V1*G to form a film layer.

2. The method according to claim 1, wherein, upon a value of the Xi/G being greater than or equal to 2, two adjacent ones of the subunits of the i-th kind of sub-pixel are separated from each other.

3. The method according to claim 1, further comprising: before performing the inkjet printing, forming a unit define layer in the i-th kind of sub-pixel with the Xi/G greater than or equal to 2, to define the Xi/G subunits.

4. The method according to claim 3, further comprising: upon a value of the Xi/G being greater than or equal to 2, forming a channel for connecting two adjacent ones of the subunits in the unit define layer between the two adjacent ones of the subunits of the i-th kind of sub-pixel, wherein, in a direction perpendicular to an arrangement direction of the two adjacent ones of the subunits, a size of the channel is less than a size of each of the subunits.

5. The method according to claim 1, wherein performing the inkjet printing on each of the subunits of the i-th kind of sub-pixel with a solvent volume of V1*G to form the film layer comprises:

performing the inkjet printing of a solution comprising the solvent of the solvent volume of V1*G on each of the subunits of the i-th kind of sub-pixel; and simultaneously drying the solutions of the n kinds of sub-pixels to form the film layer.

6. The method according to claim 1, wherein the film layer comprises at least one selected from the group consisting of a light emitting layer, an electron transport layer, an electron injection layer, a hole transport layer, and a hole injection layer.

7. The method according to claim 1, wherein, upon a value of the Xi/G being greater than or equal to 2, an interval between two adjacent ones of the subunits of the i-th kind of sub-pixel is not greater than an interval between two adjacent ones of sub-pixels in the n kinds of sub-pixels.

8. The method according to claim 1, wherein calculating the Xi value comprises: upon a number of digits after a decimal point of the Xi value being greater than or equal to 2, reserving one decimal number for the Xi value by a rounding-off method.

9. The method according to claim 1, wherein an area of the film layer of the i-th kind of sub-pixel is recorded as Si; areas of the film layers of at least one two kinds of sub-pixels in the n kinds of sub-pixels are different; and the solvent volumes Vi for forming the film layers of the at least two kinds of sub-pixels are positively related to the area Si.

10. The method according to claim 1, wherein n is equal to 3 and the n kinds of sub-pixels are respectively red sub-pixels, green sub-pixels, and blue sub-pixels.

11. The method according to claim 1, wherein
$Vi=Ci*(1-Bi)$,

Ci refers to the solution volume required for the inkjet printing of the i-th kind of sub-pixel, and Bi refers to a volume concentration of the solution for the inkjet printing of the i-th kind of sub-pixel.

* * * * *